US009288897B2

(12) United States Patent
Chen et al.

(10) Patent No.: US 9,288,897 B2
(45) Date of Patent: Mar. 15, 2016

(54) ENVIRONMENTAL SENSITIVE ELECTRONIC DEVICE PACKAGE

(71) Applicant: Industrial Technology Research Institute, Hsinchu (TW)

(72) Inventors: Kuang-Jung Chen, Hsinchu County (TW); Wei-Yi Lin, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 261 days.

(21) Appl. No.: 14/065,435

(22) Filed: Oct. 29, 2013

(65) Prior Publication Data

US 2014/0118975 A1 May 1, 2014

Related U.S. Application Data

(60) Provisional application No. 61/720,409, filed on Oct. 31, 2012.

(30) Foreign Application Priority Data

May 31, 2013 (TW) .............................. 102119356 A

(51) Int. Cl.
*H05K 1/18* (2006.01)
*H05K 1/02* (2006.01)

(52) U.S. Cl.
CPC .... *H05K 1/0281* (2013.01); *H05K 2201/10128* (2013.01); *H05K 2201/2009* (2013.01); *H05K 2201/2036* (2013.01)

(58) Field of Classification Search
USPC ......... 361/749–750, 760–767, 770, 782–790; 174/254–262
See application file for complete search history.

(56) References Cited

U.S. PATENT DOCUMENTS 7,652,424 B2    1/2010   Park et al.
7,671,959 B2 *  3/2010   Koo ..................... H01L 51/5237
                                                              313/493

(Continued)

FOREIGN PATENT DOCUMENTS

CN    1591527       3/2005
CN    101562233    10/2009

(Continued)

OTHER PUBLICATIONS

Richard Fu, et al., "Room Temperature Plasma Assisted Atomic Layer Deposition Al2O3 Film's Encapsulation Application in Organic Light Emitting Diodes," International Semiconductor Device Research Symposium (ISDRS), Dec. 7-9, 2011, pp. 1-2.
R.M. van der Wel, et al., "B-Dry®: Edge Sealant for Sensitive Photovoltaic Modules," 37th IEEEPhotovoltaic Specialists Conference (PVSC), Jun. 19-24, 2011, pp. 001371-001374.

(Continued)

*Primary Examiner* — Tuan T Dinh
(74) *Attorney, Agent, or Firm* — Jianq Chyun IP Office

(57) ABSTRACT

An environmental sensitive electronic device package includes a first substrate, a second substrate, an environmental sensitive electronic device, at least one side wall barrier structure, and a filler layer. The first substrate has at least one predetermined flexure area. The second substrate is located above the first substrate. The environmental sensitive electronic device is located on the first substrate and between the first substrate and the second substrate. The side wall barrier structure is located between the first substrate and the second substrate and surrounds the environmental sensitive electronic device. The side wall barrier structure has at least one flexure stress dispersing structure that is located in the predetermined flexure area. The filler layer is located between the first substrate and the second substrate and covers the side wall barrier structure and the environmental sensitive electronic device.

16 Claims, 16 Drawing Sheets

(56) References Cited

U.S. PATENT DOCUMENTS

| | | | |
|---|---|---|---|
| 8,093,512 | B2 | 1/2012 | Chen et al. |
| 8,317,562 | B2 | 11/2012 | Nguyen et al. |
| 8,987,758 | B2 * | 3/2015 | Han .............. H05B 33/04 257/100 |
| 2007/0172971 | A1 * | 7/2007 | Boroson .......... H01L 51/5246 438/26 |
| 2009/0167132 | A1 | 7/2009 | Bae et al. |
| 2010/0225875 | A1 | 9/2010 | Wang et al. |
| 2010/0258346 | A1 | 10/2010 | Chen et al. |
| 2011/0212304 | A1 * | 9/2011 | Han .............. H05B 33/04 428/172 |
| 2012/0024722 | A1 | 2/2012 | Chen |
| 2012/0064278 | A1 | 3/2012 | Chen |

FOREIGN PATENT DOCUMENTS

| | | |
|---|---|---|
| JP | 2010-225362 | 10/2010 |
| JP | 2012069480 | 4/2012 |
| TW | 200603416 | 1/2006 |
| TW | 201004463 | 1/2010 |
| TW | 201037799 | 10/2010 |
| TW | 201110203 | 3/2011 |
| TW | 201143503 | 12/2011 |
| TW | 201212180 | 3/2012 |
| TW | 201222683 | 6/2012 |

OTHER PUBLICATIONS

C Y Li, et al., "The Film Encapsulation of OLED Displays with Organic-Inorganic Composite Film," 58th Electronic Components and Technology Conference, May 27-30, 2008, pp. 1819-1824.

Yu-Young Wang, et al., "Direct Encapsulation of Organic Light-Emitting Devices (OLEDs) Using Photo-Curable co-Polyacrylate/Silica Nanocomposite Resin," IEEE Transactions on Advanced Packaging, vol. 30, No. 3, Aug. 2007, pp. 421-427.

Renzheng Sang, et al., "Thin Film Encapsulation for OLED Display using Silicon Nitride and Silicon Oxide Composite Film," 12th International Conference on Electronic Packaging Technology and High Density Packaging (ICEPT-HDP), Aug. 8-11, 2011, pp. 1175-1178.

Yan Zhang, et al., "Effect of Encapsulation on OLED Characteristics with Anisotropic Conductive Adhesive," 2nd Electronics System-Integration Technology Conference, Sep. 1-4, 2008, pp. 613-616.

"Office Action of Taiwan Counterpart Application," issued on Jan. 9, 2015, p. 1-p. 10.

"Office Action of Taiwan Counterpart Application", issued on May 25, 2015, p. 1-p. 7.

"Office Action of China Counterpart Application", issued on Aug. 13, 2015, p. 1-p. 8.

"Office Action of Taiwan Related Application,application No. 102133165", issued on Jul. 23, 2015, p. 1-p. 16.

* cited by examiner

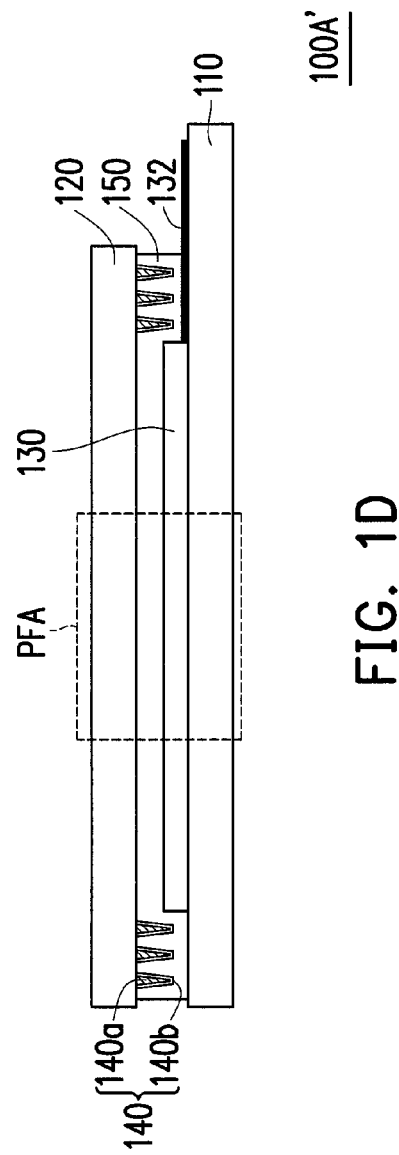
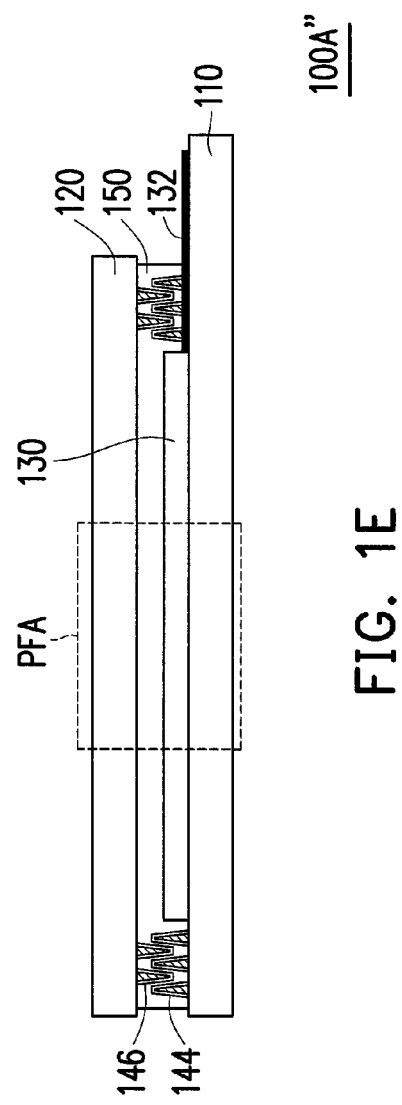

ENVIRONMENTAL SENSITIVE ELECTRONIC DEVICE PACKAGE

CROSS-REFERENCE TO RELATED APPLICATION

This application claims the priority benefits of U.S. provisional application Ser. No. 61/720,409, filed on Oct. 31, 2012 and Taiwan application serial no. 102119356, filed on May 31, 2013. The entirety of each of the above-mentioned patent applications is hereby incorporated by reference herein and made a part of this specification.

TECHNICAL FIELD

The technical field relates to a package, an environmental sensitive electronic device package.

BACKGROUND

With the progress of display technology, displays have been developed in the trend of slimness and flexibility, and flexible displays (for example, foldable displays) have gradually become the next-generation displays. The flexible displays are made by flexible substrates in replacement of rigid substrates. The flexible substrates are characterized by bendability, ease of carriage, compliance with safety standards, and extensive applications in consumer products. However, the flexible substrates also have large coefficient of thermal expansion and poor resistance to heat, moisture, oxygen, and chemicals. A flexible substrate may serve to hold electronic devices and/or act as a cover, so as to perform a packaging process on the electronic devices. Since the flexible substrate may not completely block moisture infiltration and oxygen diffusion, the moisture infiltration and the oxygen diffusion may speed up the aging process of the environmental sensitive electronic devices on the flexible substrate. As a result, the lifetime of the environmental sensitive electronic devices is shortened.

A side wall barrier structure is employed according to the related art, so as to enhance the ability of the flexible display to block moisture and oxygen on edge seal. The side wall barrier structure is formed on the flexible substrate and is adhered to another flexible substrate by means of an adhesive, and thereby the ability of the flexible display with respect to the lateral resistance to water and oxygen may be further improved. In the event that the flexible display is in a bent state for a period of time, the side wall barrier structure may be deformed or even damaged, such that the moisture infiltration and oxygen diffusion into the flexible display may not be effectively prevented.

SUMMARY

According to an exemplary embodiment of the disclosure, an environmental sensitive electronic device package includes a first substrate, a second substrate, an environmental sensitive electronic device, at least one side wall barrier structure, and a filler layer. The first substrate has at least one predetermined flexure area. The second substrate is located above the first substrate. The environmental sensitive electronic device is located on the first substrate and between the first substrate and the second substrate. The side wall barrier structure is located between the first substrate and the second substrate and surrounds the environmental sensitive electronic device. the side wall barrier structure has at least one flexure stress dispersing structure. The flexure stress dispersing structure is located in the predetermined flexure area. The filler layer is located between the first substrate and the second substrate and covers the side wall barrier structure and the environmental sensitive electronic device.

Several exemplary embodiments accompanied with figures are described in detail below to further describe the disclosure in details.

BRIEF DESCRIPTION OF DRAWINGS

The accompanying drawings are included to provide further understanding, and are incorporated in and constitute a part of this specification. The drawings illustrate exemplary embodiments and, together with the description, serve to explain the principles of the disclosure.

FIG. 1C' is a schematic partial cross-sectional diagram illustrating an environmental sensitive electronic device package according to another exemplary embodiment of the disclosure.

FIG. 1D is a schematic cross-sectional diagram illustrating another environmental sensitive electronic device package according to the first exemplary embodiment of the disclosure.

FIG. 1E is a schematic cross-sectional diagram illustrating another environmental sensitive electronic device package according to the first exemplary embodiment of the disclosure.

FIG. 6(a) and FIG. 6(b) are schematic partial diagrams illustrating wave-shaped flexure stress dispersing structures according to other exemplary embodiments of the disclosure.

FIG. 9(a) to FIG. 9(e) are schematic partial diagrams illustrating grid-shaped flexure stress dispersing structures according to other exemplary embodiments of the disclosure.

DETAILED DESCRIPTION OF DISCLOSED EMBODIMENTS

Figure 1A:
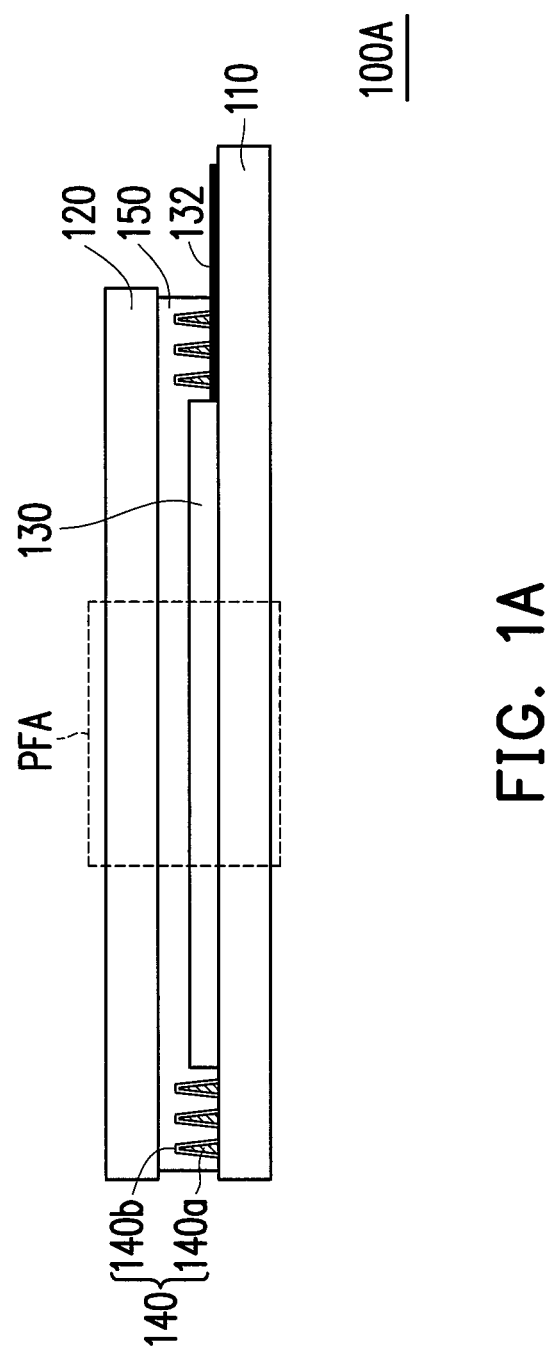
FIG. 1A is a schematic cross-sectional diagram illustrating an environmental sensitive electronic device package according to a first exemplary embodiment of the disclosure.

An exemplary embodiment of the disclosure provides an environmental sensitive electronic device package to resolve an issue of a deformed or damaged side wall barrier structure of the environmental sensitive electronic device package after the environmental sensitive electronic device package is in a bent state for a period of time.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
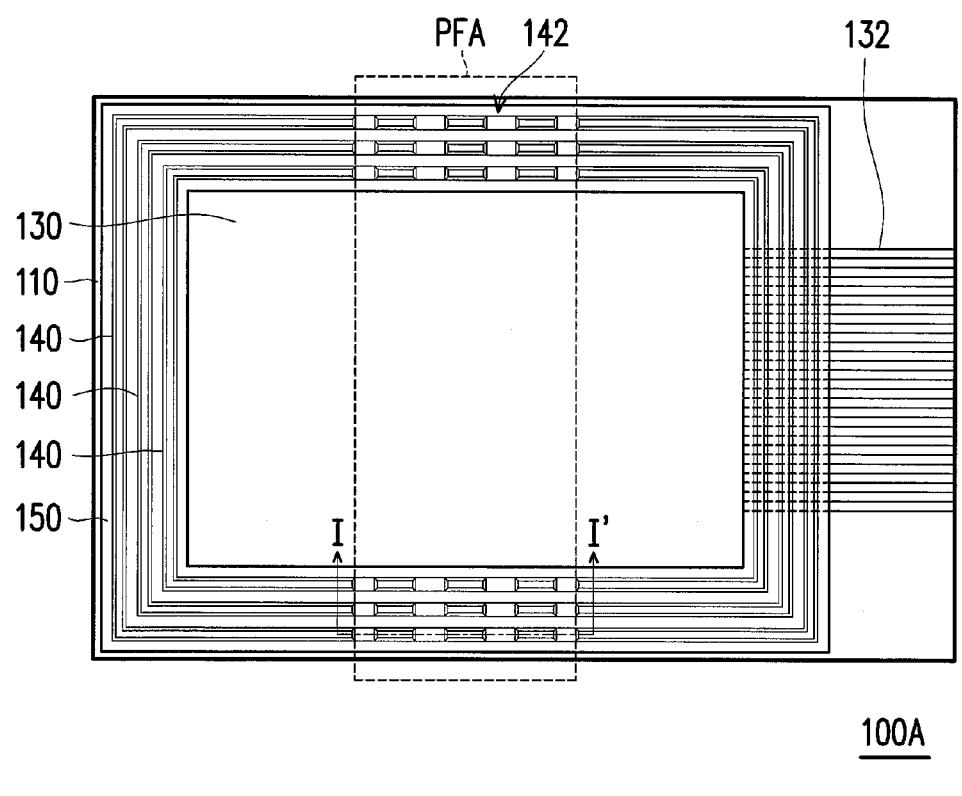
FIG. 1B is a schematic top view illustrating the environmental sensitive electronic device package depicted in FIG. 1A.
Figure 1C:
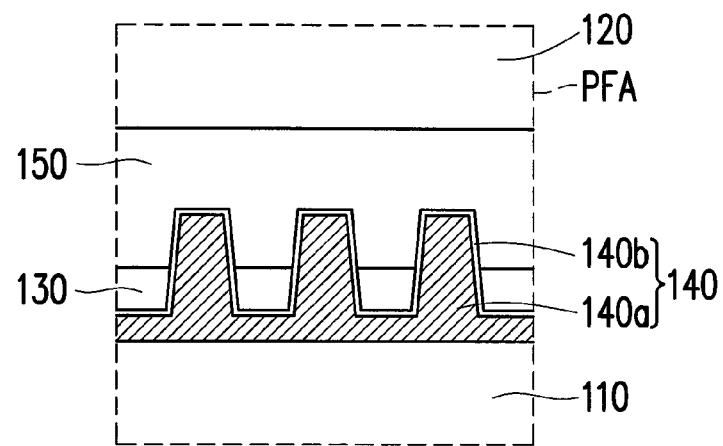
FIG. 1C is a schematic partial cross-sectional diagram illustrating the environmental sensitive electronic device package depicted in FIG. 1B along a sectional line I-I'.
Figure 1C:
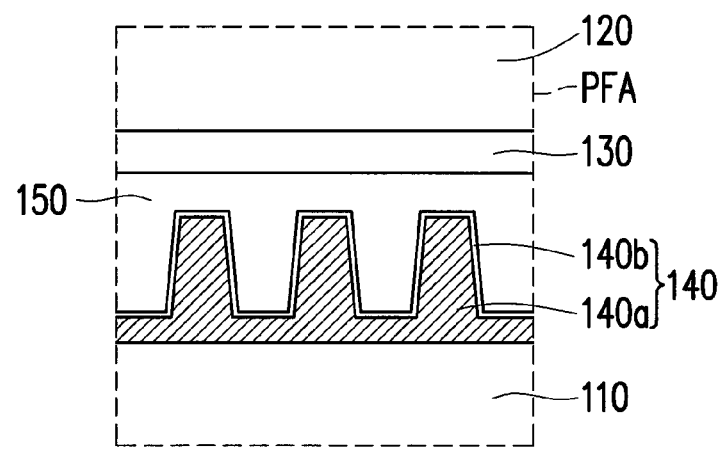

FIG. 1A is a schematic cross-sectional diagram illustrating an environmental sensitive electronic device package according to a first exemplary embodiment of the disclosure. FIG. 1B is a schematic top view illustrating the environmental sensitive electronic device package depicted in FIG. 1A. FIG. 1C is a schematic partial cross-sectional diagram illustrating the environmental sensitive electronic device package depicted in FIG. 1B along a sectional line I-I'. FIG. 1C' is a schematic partial cross-sectional diagram illustrating an environmental sensitive electronic device package according to another exemplary embodiment of the disclosure. As shown in FIG. 1A, in the exemplary embodiment of the disclosure, the environmental sensitive electronic device package 100A includes a first substrate 110, a second substrate 120, an environmental sensitive electronic device 130, at least one side barrier structures 140, and a filler layer 150. The first substrate 110 has at least one predetermined flexure area PFA. The second substrate 120 is located above the first substrate 110. The environmental sensitive electronic device 130 is located on the first substrate 110 and between the first substrate 110 and the second substrate 120. The side wall barrier structure 140 is located between the first substrate 110 and the second substrate 120 and surrounds the environmental sensitive electronic device 130. The side wall barrier structure 140 has at least one flexure stress dispersing structure 142. The flexure stress dispersing structure 142 is located in the predetermined flexure area PFA. The filler layer 150 is located between the first substrate 110 and the second substrate 120 and covers the side wall barrier structure 140 and the environmental sensitive electronic device 130.

In the present exemplary embodiment, the first substrate 110 and the second substrate 120 are flexible substrates, for instance, and a material of the flexible substrates may be polyethylene terephthalate (PET), polyethylene naphthalate (PEN), polyethersulfone (PES), polymethyl methacrylate (PMMA), polycarbonate (PC), polyimide (PI), metal foil, or ultra thin glass. The first substrate 110 and the second substrate 120 may also be rigid substrates made of metal or glass, for instance, which should not be construed as a limitation to the disclosure.

The environmental sensitive electronic device 130 is, for instance, an active environmental sensitive electronic display device or a passive environmental sensitive electronic display device. The active environmental sensitive electronic display device is, for instance, an active matrix organic light emitting diode (AM-OLED), an active matrix electro phoretic display (AM-EPD) commonly known as electronic paper, an active matrix liquid crystal display (AM-LCD), or an active matrix blue phase liquid crystal display (AMBPLCD). The passive environmental sensitive electronic display device is, for instance, a passive matrix OLED (PM-OLED) or a super twisted nematic liquid crystal display (STN-LCD). The environmental sensitive electronic device package 100A further includes a conductive wire 132. The conductive wire 132 is located on the first substrate 110 and electrically connected to the environmental sensitive electronic device 130. The conductive wire 132 may be formed on a metal conductive wire layer on the first substrate 110 through wet coating, for instance.

As shown in FIG. 1C', in another exemplary embodiment, the environmental sensitive electronic device 130 may be located on the second substrate 120, and the disclosure is not limited thereto.

With reference to FIG. 1A, FIG. 1C and FIG. 1C', the number of the at least one side wall barrier structures 140 is plural, and a shape of a cross-section of the side wall barrier structures 140 perpendicular to the first substrate 110 may include a polygonal shape, a circular shape, or an elliptic shape. In the present exemplary embodiment, the cross-section of the side wall barrier structures 140 perpendicular to the first substrate 110 is shaped as a trapezoid, for instance. The side wall barrier structures 140 are located on the first substrate 110, and each of the side wall barrier structures 140 may further include a barrier layer 140a and a cover layer 140b. The barrier layer 140a is located on the first substrate 110 and covered by the cover layer 140b.

In most cases, the barrier layer 140a is made of an organic material, a metallic material, an inorganic material, or a combination of organic and inorganic materials, for instance. In the present exemplary embodiment, the barrier layer 140a is made of an organic photoresist material, e.g., photosensitive PI, and is formed on the first substrate 110 through exposure, development, etching, and so forth. The cover layer 140b may be made of an inorganic material or a metallic material. Here, the inorganic material may be silicide or aluminide, silicide may be silicon nitride ($SiN_x$), silicon oxide ($SiO_x$), silicon oxynitride ($SiN_xO_y$), etc., and aluminide may be aluminum oxide ($Al_2O_3$). The inorganic material is formed on the barrier layer 140a through chemical vapor deposition (CVD), evaporation, or sputtering, for instance. The metallic material is, for instance, molybdenum (Mo), titanium (Ti), aluminum (Al), or chromium (Cr) and is formed on the barrier layer 140a through evaporation, sputtering, or wet coating, for instance. The barrier layer 140a and the cover layer 140b may be made of the same material (e.g., metal or glass) as that of the first substrate 110 and may be formed on the first substrate 110 through exposure, development, and etching, which should not be construed as limitations to the disclosure.

With reference to FIG. 1B, FIG. 1C and FIG. 1C', in the present exemplary embodiment, the side wall barrier structures 140 are surrounding structures comprising a plurality of connected linear patterns surround the environmental sensitive electronic device 130. The side wall barrier structures 140 within the predetermined flexure area PFA constitute a plurality of flexure stress dispersing structures 142 through etching, for instance. In a method of forming the flexure stress dispersing structures 142 in the predetermined flexure area PFA, a portion of the barrier layer 140a in the predetermined flexure area PFA is etched before the cover layer 140b is formed on the barrier layer 140a. The etching process is performed and do not exposed the surface of the first substrate 110 in principle. The cover layer 140b is then formed on the barrier layer 140a, so as to form the flexure stress dispersing structures 142 in the predetermined flexure area PFA. That is, the flexure stress dispersing structures 142 are parts of the side wall barrier structures 140, and the flexure stress dispersing structures 142 are connected to each other through the barrier layer 140a, so as to constitute a continuous structure. In an exemplary embodiment of the disclosure, the process of forming the flexure stress dispersing structures 142, the barrier layer 140a in the predetermined flexure area PFA may also be etched until the surface of the first surface is exposed. In other words, the flexure stress dispersing structures 142 may comprises non-continuous, non-connected structures, which should not be construed as a limitation to the disclosure.

In an exemplary embodiment that is not shown, each side wall barrier structure 140 may be a single-layered gas barrier structure equipped with the barrier layer 140a, and the flexure stress dispersing structure 142 in each side wall barrier structure 140 is formed by etching the barrier layer 140a, for instance.

In another aspect, according to the present exemplary embodiment, the number of the predetermined flexure area PFA is one, and the flexure stress dispersing structures 142 may comprise linear patterns and are arranged in parallel in the predetermined flexure area PFA. Hence, when the environmental sensitive electronic device package 100A is bent along the predetermined flexure area PFA, the flexure stress dispersing structures 142 may prevent the side wall barrier structures 140 in the predetermined flexure area PFA from being deformed or damaged caused by concentrated stress after the environmental sensitive electronic device package 100A is in a bent state for a period of time.

With reference to FIG. 1A, the filler layer 150 is formed by an adhesive that is cured by ultraviolet light or heat, for instance. The adhesive is, for instance, made of acrylic, epoxy or silicon base resin. In the present exemplary embodiment, before the filler layer 150 is cured, the filler layer 150 is a liquid-type adhesive or a sheet-type adhesive, for instance.

The side wall barrier structures 140 of the environmental sensitive electronic device package 100A has the flexure stress dispersing structures 142 with linear patterns, so as to prevent the side wall barrier structures 140 from being deformed or damaged after the environmental sensitive electronic device package 100A is in a bent state for a period of time. Thereby, the environmental sensitive electronic device package 100A is capable of blocking moisture infiltration and oxygen diffusion, so as to effectively extend the lifetime of the environmental sensitive electronic device 130. The side wall barrier structures 140 of the environmental sensitive electronic device package 100A described herein are continuous surrounding structures comprising a plurality of connected linear patterns surround the environmental sensitive electronic device 130, which should however not be construed as limitations to the disclosure. That is, in other exemplary embodiments, the side wall barrier structures 140 may be linear pattern located at least one side of the environmental sensitive electronic device 130, U-shaped or L-shaped patterns located at least one side of the environmental sensitive electronic device 130, or other non-continuous structures surrounding the environmental sensitive electronic device 130. Here, the U-shaped or L-shaped patterns may comprise a plurality of connected linear patterns, a plurality of connected non-linear patterns, or the combination of the linear patterns and the non-linear patterns.

FIG. 1D is a schematic cross-sectional diagram illustrating another environmental sensitive electronic device package according to the first exemplary embodiment of the disclosure. The environmental sensitive electronic device package 100A' shown in FIG. 1D may be substantially identical or similar to the environmental sensitive electronic device package 100A depicted in FIG. 1A, while one of the differences therebetween lies in that the side wall barrier structures 140 of the environmental sensitive electronic device package 100A' shown in FIG. 1D are located on the second substrate 120, for instance, and each side wall barrier structure 140 described herein may further include the barrier layer 140a and the cover layer 140b. The barrier layer 140a is located on the second substrate 120 and covered by the cover layer 140b. In one embodiment, the barrier layer 140a is made of an organic material, a metallic material, an inorganic material, or a combination of organic and inorganic materials, for instance. In the present exemplary embodiment, the barrier layer 140a may be made of an organic photoresist material, e.g., photosensitive PI, and is formed on the second substrate 120 through exposure, development, etching, and so forth. The cover layer 140b may be made of an inorganic material or a metallic material. Here, the inorganic material may be silicide or aluminide, silicide may be $SiN_x$, $SiO_x$, $SiN_xO_y$, etc., and aluminide may be $Al_2O_3$. The inorganic material is formed on the barrier layer 140a through CVD, evaporation, or sputtering, for instance. The metallic material is, for instance, Mo, Ti, Al, or Cr and is formed on the barrier layer 140a through evaporation, sputtering, or wet coating, for instance. The barrier layer 140a, the cover layer 140b, and the second substrate 120 may be made of the same material (e.g., metal or glass) and may be formed on the second substrate 120 through exposure, development, and etching, which should not be construed as limitations to the disclosure.

FIG. 1E is a schematic cross-sectional diagram illustrating another environmental sensitive electronic device package according to the first exemplary embodiment of the disclosure. The environmental sensitive electronic device package 100A" shown in FIG. 1E may be substantially identical or similar to the environmental sensitive electronic device package 100A depicted in FIG. 1A, while one of the differences therebetween lies in that the side wall barrier structures 140 of the environmental sensitive electronic device package 100A" shown in FIG. 1E may further include first side wall barrier structures 144 and second side wall barrier structures 146. The first side wall barrier structures 144 are located on the first substrate 110. The second side wall barrier structures 146 are located on the second substrate 120, and the first side wall barrier structures 144 and the second side wall barrier structures 146 are alternately arranged between the first substrate 110 and the second substrate 120. In another exemplary embodiment of the disclosure not shown herein, the first side wall barrier structures 144 may directly face the second side wall barrier structures 146 and may be arranged between the first substrate 110 and the second substrate 120, which should not be construed as limitations to the disclosure.

The side wall barrier structures 140 described in the previous embodiment has the flexure stress dispersing structures 142 with linear patterns, and the flexure stress dispersing structures 142 are arranged in parallel in the predetermined flexure area PFA. In other exemplary embodiments, any different structural design or configuration that may prevent the side wall barrier structures 140 from being deformed or damaged after the side wall barrier structures 140 are in a bent state for a period of time is still deemed an applicable technical scheme and falls within the scope of protection provided in the disclosure. The following are descriptions of different exemplary embodiments detailing different designs of environmental sensitive electronic device packages 100B to 100N.

Figure 2:
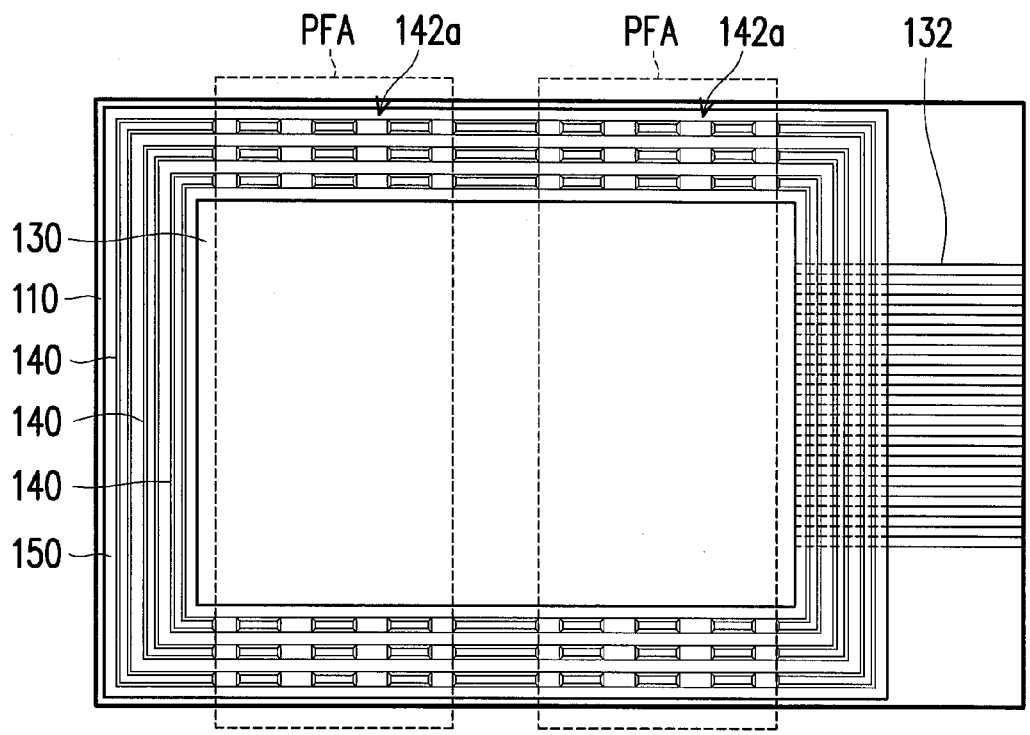
FIG. 2 is a schematic top view illustrating an environmental sensitive electronic device package according to a second exemplary embodiment of the disclosure.

FIG. 2 is a schematic top view illustrating an environmental sensitive electronic device package according to a second exemplary embodiment of the disclosure. The environmental sensitive electronic device package 100B shown in FIG. 2 is similar to the environmental sensitive electronic device package 100A shown in FIG. 1B, while one of the differences therebetween lies in that the number of the predetermined flexure areas PFA in FIG. 2 is two. In the configuration, not only folded times of the environmental sensitive electronic device package 100B bent along the predetermined flexure areas PFA can be elevated, the flexure stress dispersing structures 142a may prevent the side wall barrier structures 140 in the predetermined flexure areas PFA from being deformed or damaged caused by concentrated stress after the environmental sensitive electronic device package 100B is in a bent state for a period of time.

Figure 3:
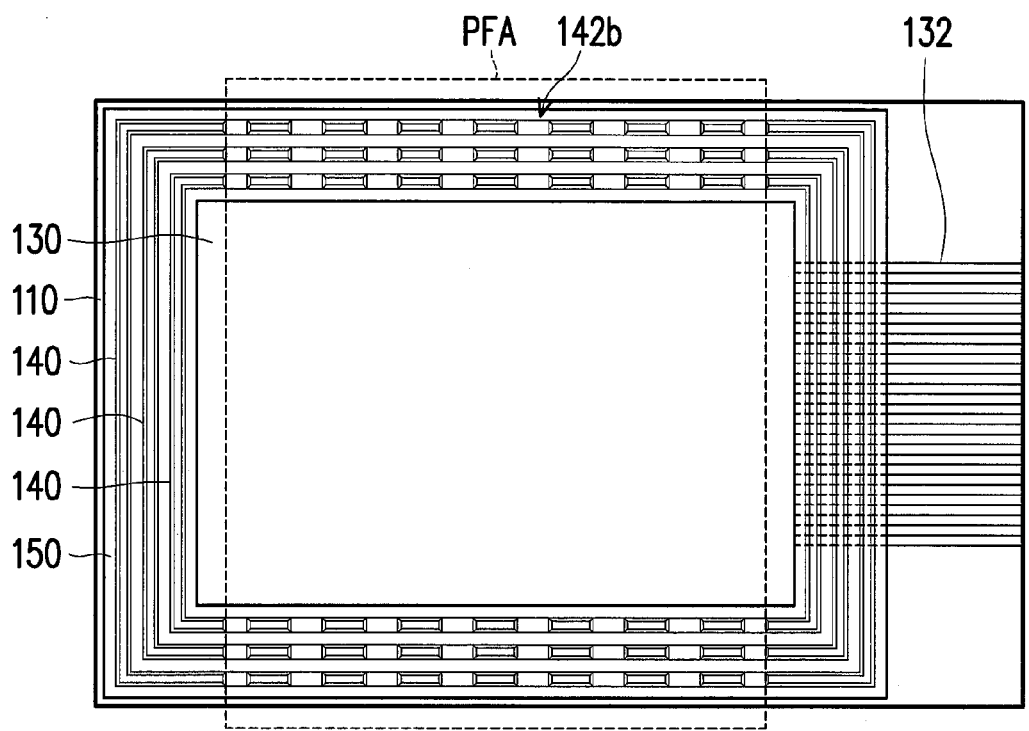
FIG. 3 is a schematic top view illustrating an environmental sensitive electronic device package according to a third exemplary embodiment of the disclosure.

FIG. 3 is a schematic top view illustrating an environmental sensitive electronic device package according to a third exemplary embodiment of the disclosure. The environmental sensitive electronic device package 100C shown in FIG. 3 is similar to the environmental sensitive electronic device package 100A shown in FIG. 1B, while one of the differences therebetween lies in that the predetermined flexure areas PFA may almost cover the entire surface of the environmental sensitive electronic device 130. Hence, even the environmental sensitive electronic device package 100C is bent along the predetermined flexure areas PFA and forms a roll-shaped structure, the flexure stress dispersing structures 142b may prevent the side wall barrier structures 140 in the predetermined flexure areas PFA from being deformed or damaged caused by concentrated stress after the environmental sensitive electronic device package 100C is in a bent state for a period of time.

Figure 4:
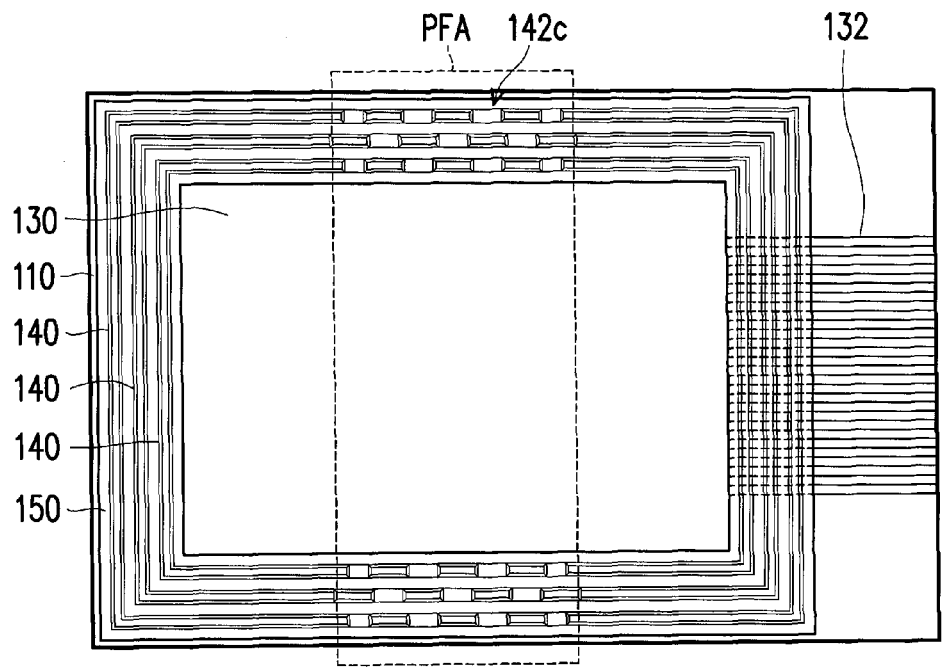
FIG. 4 is a schematic top view illustrating an environmental sensitive electronic device package according to a fourth exemplary embodiment of the disclosure.

FIG. 4 is a schematic top view illustrating an environmental sensitive electronic device package according to a fourth exemplary embodiment of the disclosure. The environmental sensitive electronic device package 100D shown in FIG. 4 is similar to the environmental sensitive electronic device package 100A shown in FIG. 1B, while one of the differences therebetween lies in that the flexure stress dispersing structures 142c of the side wall barrier structures 140 of the environmental sensitive electronic device package 100D shown in FIG. 4 comprises a plurality of linear patterns arranged in columns and rows in the predetermined flexure area PFA. Hence, when the environmental sensitive electronic device package 100D is bent along the predetermined flexure area PFA, the flexure stress dispersing structures 142c may prevent the side wall barrier structures 140 in the predetermined flexure area PFA from being deformed or damaged caused by concentrated stress after the environmental sensitive electronic device package 100D is in a bent state for a period of time.

Figure 5:
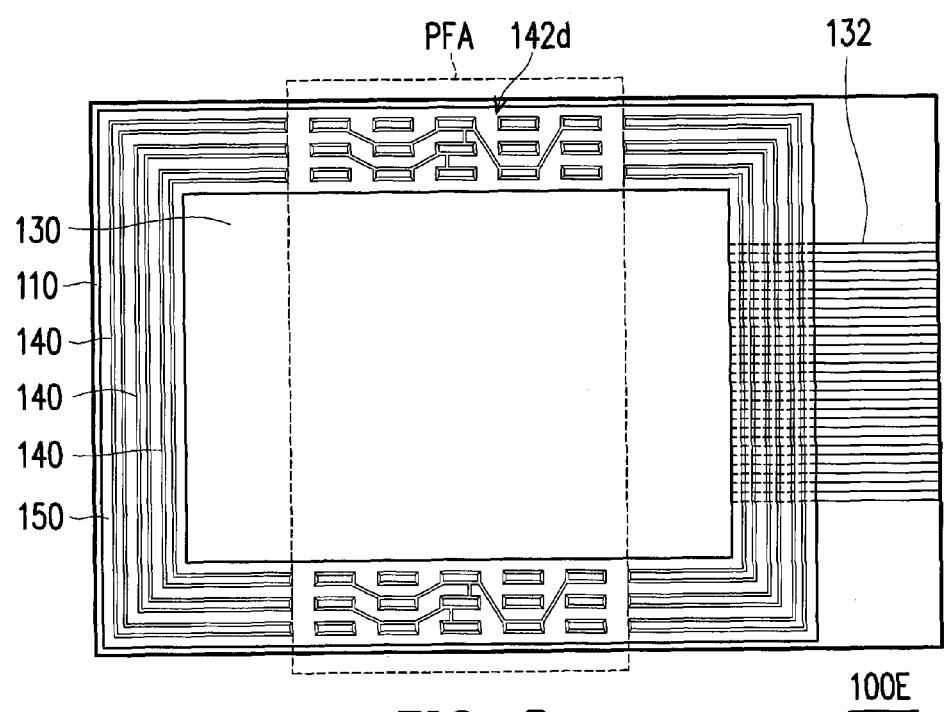
FIG. 5 is a schematic top view illustrating an environmental sensitive electronic device package according to a fifth exemplary embodiment of the disclosure.

FIG. 5 is a schematic top view illustrating an environmental sensitive electronic device package according to a fifth exemplary embodiment of the disclosure. The environmental sensitive electronic device package 100E shown in FIG. 5 is similar to the environmental sensitive electronic device package 100A shown in FIG. 1B, while one of the differences therebetween lies in that the flexure stress dispersing structures 142d of the side wall barrier structures 140 of the environmental sensitive electronic device package 100E shown in FIG. 5 comprises a plurality of connected linear patterns arranged in parallel in the predetermined flexure area PFA. As a result, enhance the capability of preventing moisture and oxygen from entering the predetermined flexure area PFA. The location where the flexure stress dispersing structures 142d are connected to one another in the predetermined flexure area PFA and the connection manner are not limited in the disclosure. Hence, when the environmental sensitive electronic device package 100E is bent along the predetermined flexure area PFA, the flexure stress dispersing structures 142d may prevent the side wall barrier structures 140 in the predetermined flexure area PFA from being deformed or damaged caused by concentrated stress after the environmental sensitive electronic device package 100E is in a bent state for a period of time.

Figure 6:
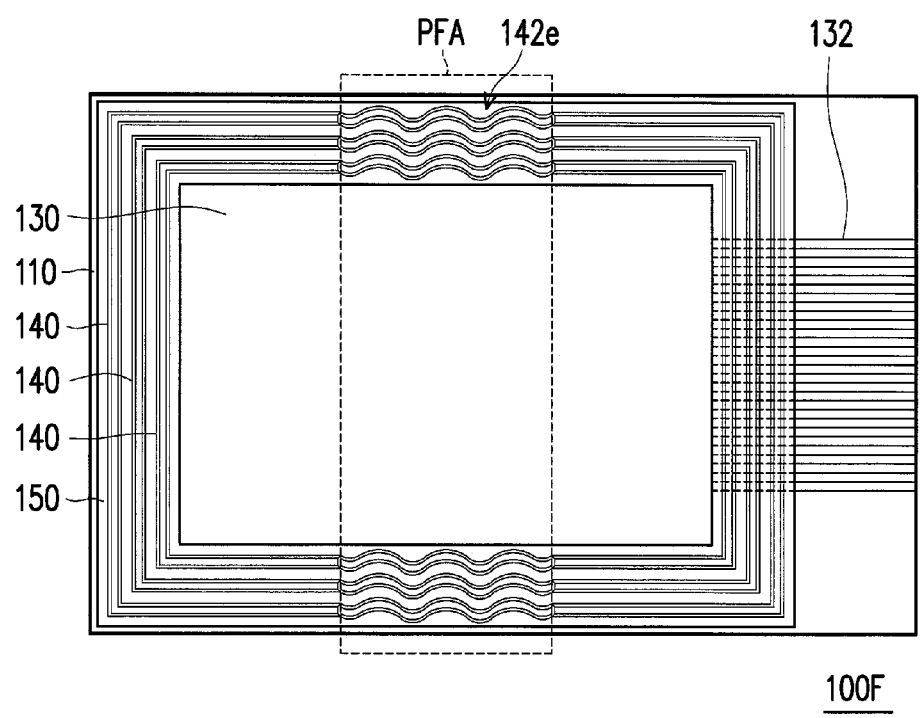
FIG. 6 is a schematic top view illustrating an environmental sensitive electronic device package according to a sixth exemplary embodiment of the disclosure.
Figure 6:
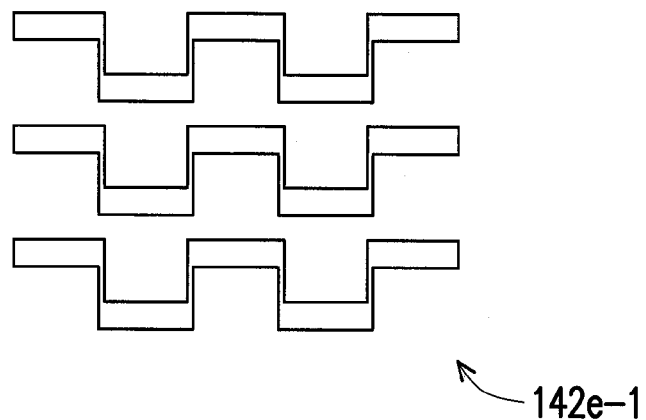
Figure 6:
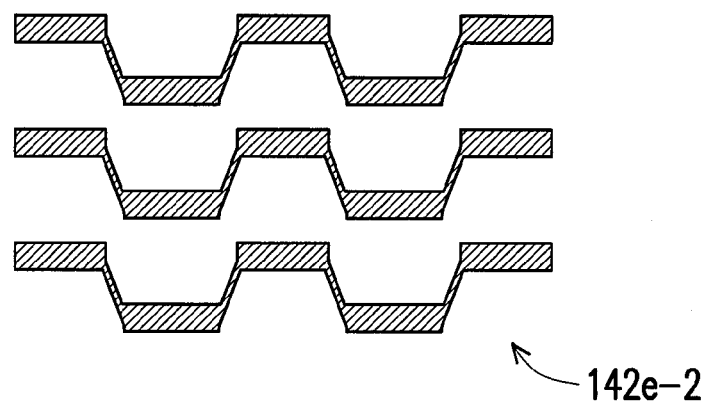

FIG. 6 is a schematic top view illustrating an environmental sensitive electronic device package according to a sixth exemplary embodiment of the disclosure. The environmental sensitive electronic device package 100F shown in FIG. 6 is similar to the environmental sensitive electronic device package 100A shown in FIG. 1B, while one of the differences therebetween lies in that the flexure stress dispersing structures 142e of the side wall barrier structures 140 of the environmental sensitive electronic device package 100F shown in FIG. 6 comprises a plurality of non-linear patterns (e.g., wave patterns) arranged in parallel in the predetermined flexure area PFA. Hence, when the environmental sensitive electronic device package 100F is bent along the predetermined flexure area PFA, the flexure stress dispersing structures 142e may prevent the side wall barrier structures 140 in the predetermined flexure area PFA from being deformed or damaged caused by concentrated stress after the environmental sensitive electronic device package 100F is in a bent state for a period of time.

FIG. 6(a) and FIG. 6(b) are schematic partial diagrams illustrating non-linear flexure stress dispersing structures according to other exemplary embodiments of the disclosure. With reference to FIG. 6(a), the flexure stress dispersing structures 142e-1 are square wave-shaped patterns arranged in parallel in the predetermined flexure area PFA. With reference to FIG. 6(b), the flexure stress dispersing structures 142e-2 are trapezoid wave-shaped patterns arranged in parallel in the predetermined flexure area PFA. In other exemplary embodiments of the disclosure not shown herein, the flexure stress dispersing structures may be other types of non-linear patterns, which should not be construed as a limitation to the disclosure.

Figure 7:
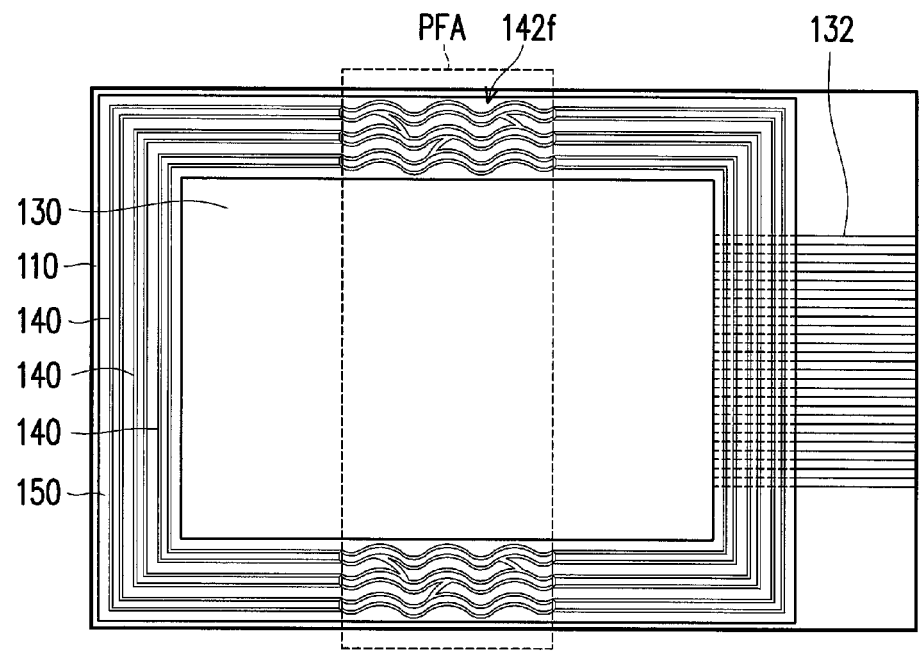
FIG. 7 is a schematic top view illustrating an environmental sensitive electronic device package according to a seventh exemplary embodiment of the disclosure.

FIG. 7 is a schematic top view illustrating an environmental sensitive electronic device package according to a seventh exemplary embodiment of the disclosure. The environmental sensitive electronic device package 100G shown in FIG. 7 is similar to the environmental sensitive electronic device package 100A shown in FIG. 1B, while one of the differences therebetween lies in that the flexure stress dispersing structures 142f of the side wall barrier structures 140 of the environmental sensitive electronic device package 100G shown in FIG. 7 comprises a plurality of connected non-linear patterns arranged in parallel in the predetermined flexure area PFA. As a result, enhance the capability of preventing moisture and oxygen from entering the predetermined flexure area PFA. The location where the flexure stress dispersing structures 142f are connected to one another and the connection manner are not limited in the disclosure. Hence, when the environmental sensitive electronic device package 100G is bent along the predetermined flexure area PFA, the flexure stress dispersing structures 142f may prevent the side wall barrier structures 140 in the predetermined flexure area PFA from being deformed or damaged caused by concentrated stress after the environmental sensitive electronic device package 100G is in a bent state for a period of time.

Figure 8:
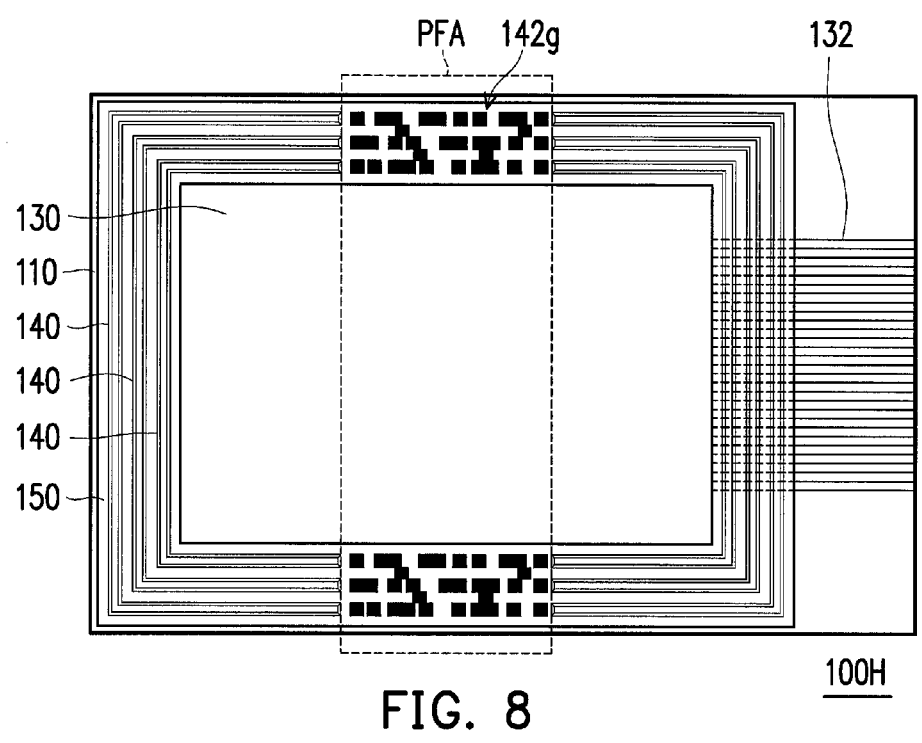
FIG. 8 is a schematic top view illustrating an environmental sensitive electronic device package according to an eighth exemplary embodiment of the disclosure.

FIG. 8 is a schematic top view illustrating an environmental sensitive electronic device package according to an eighth exemplary embodiment of the disclosure. The environmental sensitive electronic device package 100H shown in FIG. 8 is similar to the environmental sensitive electronic device package 100A shown in FIG. 1B, while one of the differences therebetween lies in that the flexure stress dispersing structures 142g of the side wall barrier structures 140 of the environmental sensitive electronic device package 100H shown in FIG. 8 are island-shaped patterns irregularly distributed in the predetermined flexure area PFA. The flexure stress dispersing structures 142g are independent from one another or connected to one another, for instance. Hence, when the environmental sensitive electronic device package 100H is bent along the predetermined flexure area PFA, the flexure stress dispersing structures 142g may prevent the side wall barrier structures 140 in the predetermined flexure area PFA from being deformed or damaged caused by concentrated stress after the environmental sensitive electronic device package 100H is in a bent state for a period of time.

Figure 9:
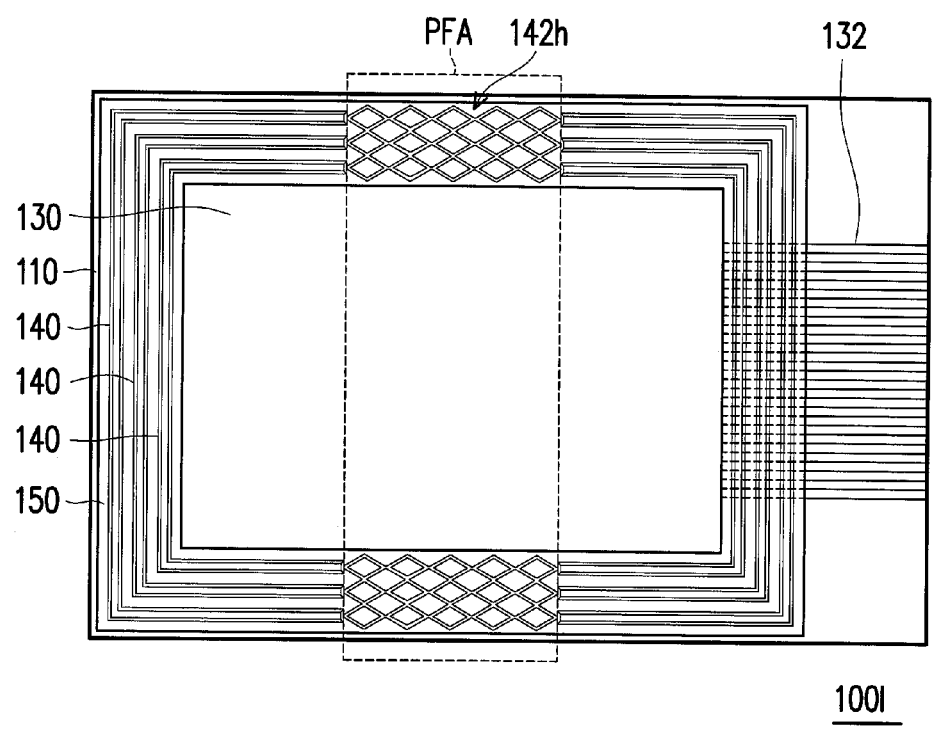
FIG. 9 is a schematic top view illustrating an environmental sensitive electronic device package according to a ninth exemplary embodiment of the disclosure.
Figure 9:
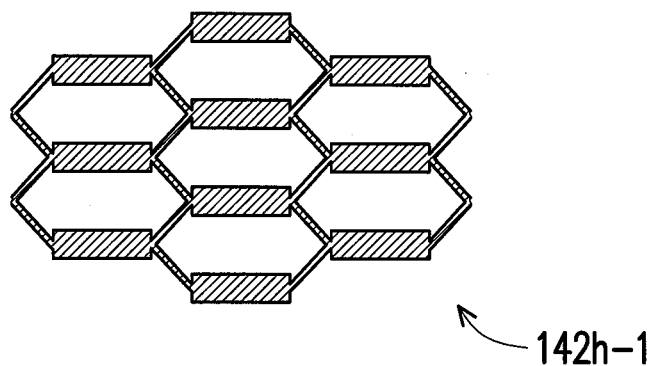
Figure 9:
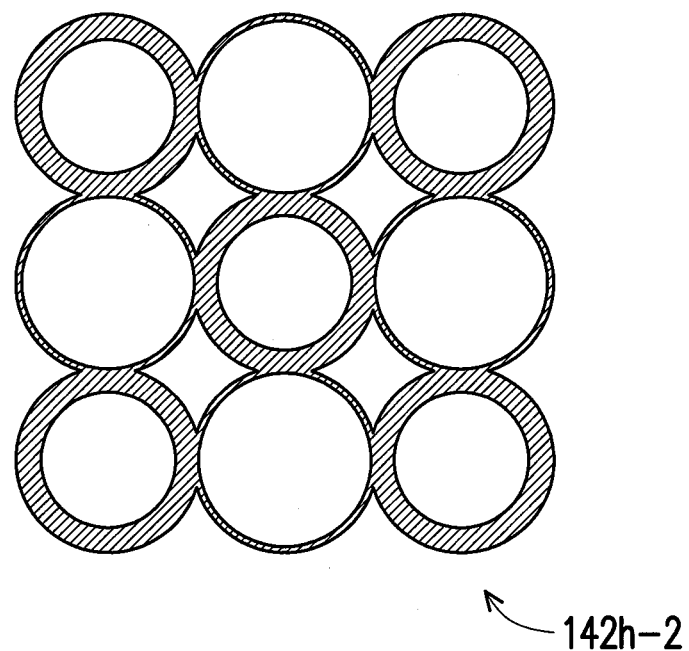
Figure 9:
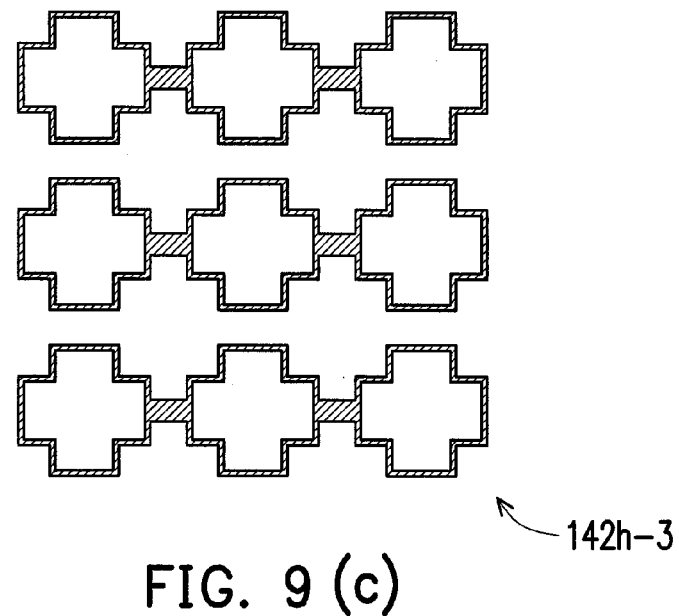
Figure 9:
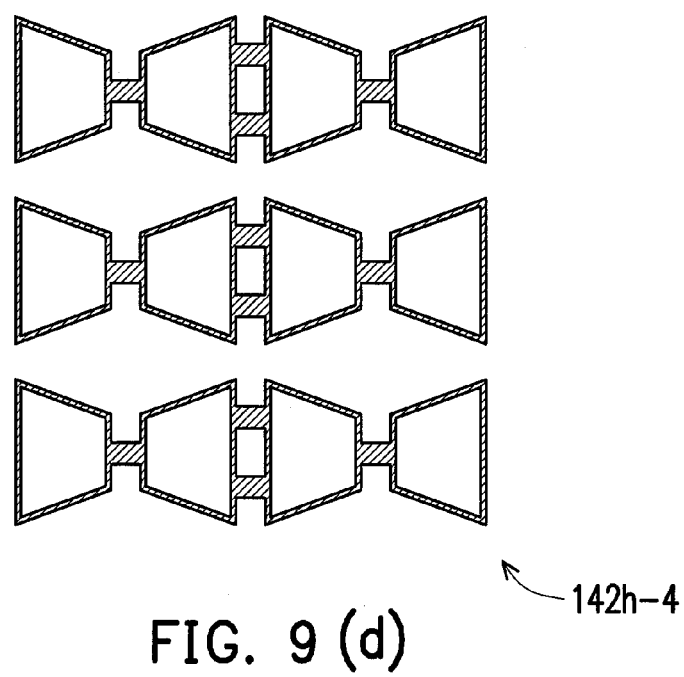
Figure 9:
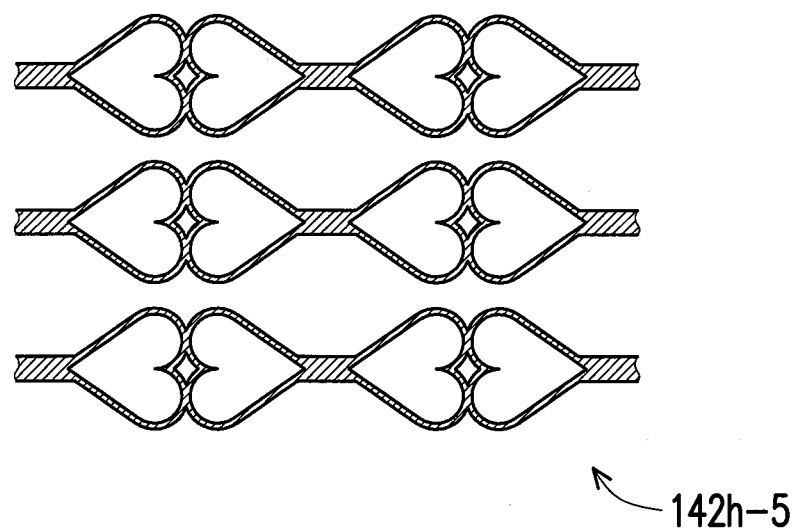

FIG. 9 is a schematic top view illustrating an environmental sensitive electronic device package according to a ninth exemplary embodiment of the disclosure. The environmental sensitive electronic device package 100I shown in FIG. 9 is similar to the environmental sensitive electronic device package 100A shown in FIG. 1B, while one of the differences therebetween lies in that the flexure stress dispersing structures 142h of the side wall barrier structures 140 of the environmental sensitive electronic device package 100I shown in FIG. 9 are grid-shaped patterns (e.g., rhombus-like grid-shaped pattern) regularly arranged in the predetermined flexure area PFA. Hence, when the environmental sensitive electronic device package 100I is bent along the predetermined flexure area PFA, the flexure stress dispersing structures 142h may prevent the side wall barrier structures 140 in the predetermined flexure area PFA from being deformed or damaged caused by concentrated stress after the environmental sensitive electronic device package 100I is in a bent state for a period of time.

FIG. 9(a) to FIG. 9(e) are schematic partial diagrams illustrating grid-shaped flexure stress dispersing structures according to other exemplary embodiments of the disclosure. With reference to FIG. 9(a), the flexure stress dispersing structures 142h-1 are hexagonal grid-shaped patterns constituted by connected grid lines with the same thickness or different thicknesses. With reference to FIG. 9(b), the flexure stress dispersing structures 142h-2 are circular grid-shaped patterns constituted by connected grid lines with the same thickness or different thicknesses. With reference to FIG. 9(c), the flexure stress dispersing structures 142h-3 are crisscross grid-shaped patterns constituted by connected grid lines with the same thickness or different thicknesses. With reference to FIG. 9(d), the flexure stress dispersing structures 142h-4 are trapezoid grid-shaped patterns constituted by connected grid lines with the same thickness or different thicknesses. With reference to FIG. 9(e), the flexure stress dispersing structures 142h-5 are heart-like grid-shaped patterns constituted by connected grid lines with the same thickness or different thicknesses. In other exemplary embodiments of the disclosure not shown herein, the flexure stress dispersing structures may be other types of polygonal grid-shaped structures, which should not be construed as a limitation to the disclosure.

Figure 10:
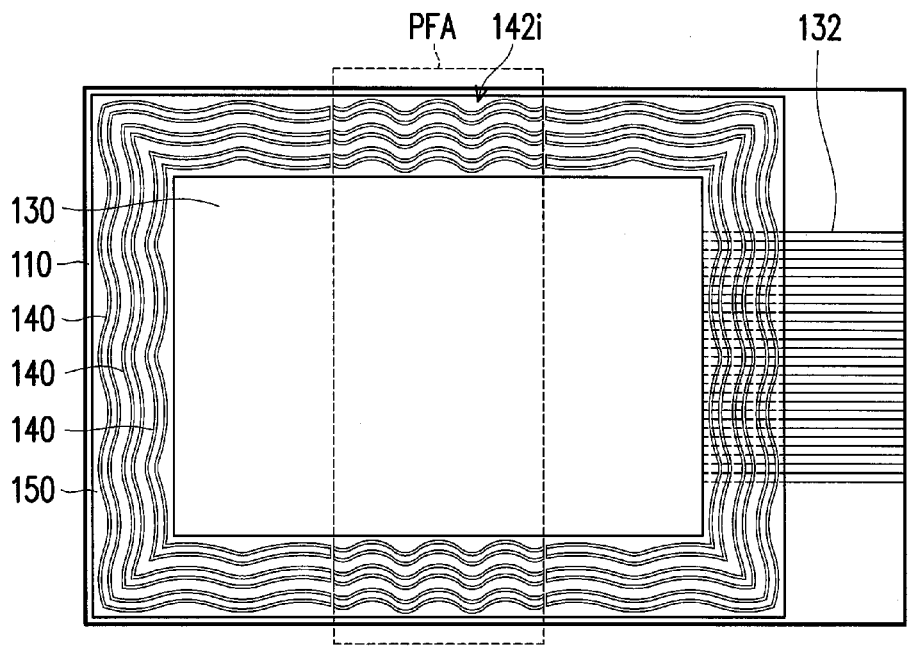
FIG. 10 is a schematic top view illustrating an environmental sensitive electronic device package according to a tenth exemplary embodiment of the disclosure.

FIG. 10 is a schematic top view illustrating an environmental sensitive electronic device package according to a tenth exemplary embodiment of the disclosure. The environmental sensitive electronic device package 100J shown in FIG. 10 is similar to the environmental sensitive electronic device package 100A shown in FIG. 1B, while one of the differences therebetween lies in that the side wall barrier structures 140 of the environmental sensitive electronic device package 100J shown in FIG. 10 are surrounding structures comprising a plurality of connected non-linear patterns (e.g., wave patterns), and the flexure stress dispersing structures 142i comprises a plurality of non-linear patterns (e.g., wave patterns) arranged in parallel in the predetermined flexure area PFA. Hence, when the environmental sensitive electronic device package 100J is bent along the predetermined flexure area PFA, the flexure stress dispersing structures 142i may prevent the side wall barrier structures 140 in the predetermined flexure area PFA from being deformed or damaged caused by concentrated stress after the environmental sensitive electronic device package 100J is in a bent state for a period of time.

Figure 11:
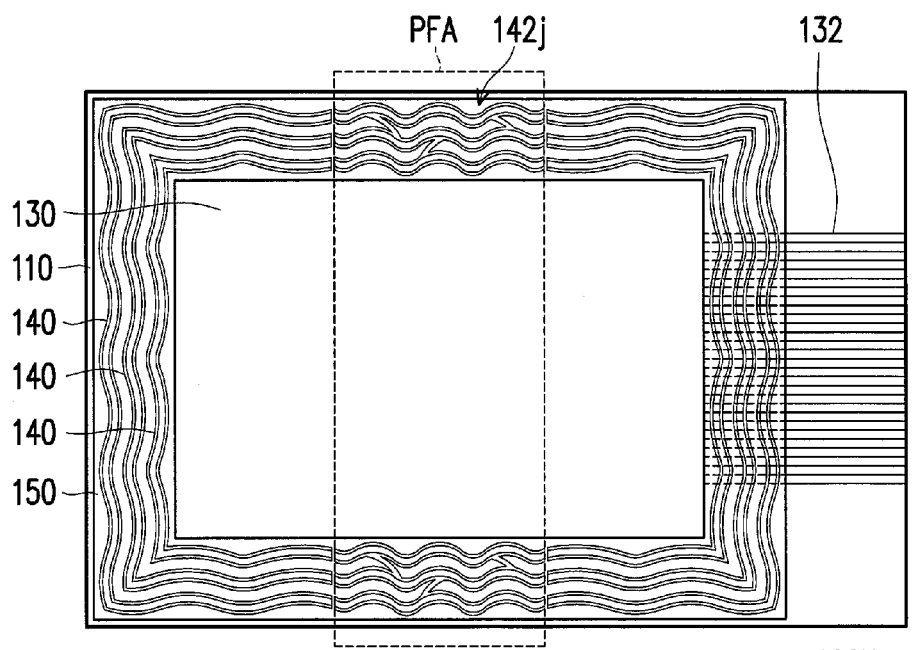
FIG. 11 is a schematic top view illustrating an environmental sensitive electronic device package according to an eleventh exemplary embodiment of the disclosure.

FIG. 11 is a schematic top view illustrating an environmental sensitive electronic device package according to an eleventh exemplary embodiment of the disclosure. The environmental sensitive electronic device package 100K shown in FIG. 11 is similar to the environmental sensitive electronic device package 100A shown in FIG. 1B, while one of the differences therebetween lies in that the side wall barrier structures 140 of the environmental sensitive electronic device package 100K shown in FIG. 11 are surrounding structures comprising a plurality of connected non-linear patterns (e.g., wave patterns), and the flexure stress dispersing structures 142j comprises a plurality of connected non-linear patterns (e.g., wave patterns) arranged in parallel in the predetermined flexure area PFA. In the present exemplary embodiment, the flexure stress dispersing structures 142j may be connected to one another, for instance. In other exemplary embodiments of the disclosure not shown herein, the side wall barrier structures 140 may comprise the flexure stress dispersing structures with linear patterns, island-shaped patterns, or grid-shaped patterns, which should not be construed as limitations to the disclosure. Hence, when the environmental sensitive electronic device package 100K is bent along the predetermined flexure area PFA, the flexure stress dispersing structures 142j may prevent the side wall barrier structures 140 in the predetermined flexure area PFA from being deformed or damaged caused by concentrated stress after the environmental sensitive electronic device package 100K is in a bent state for a period of time.

Figure 12:
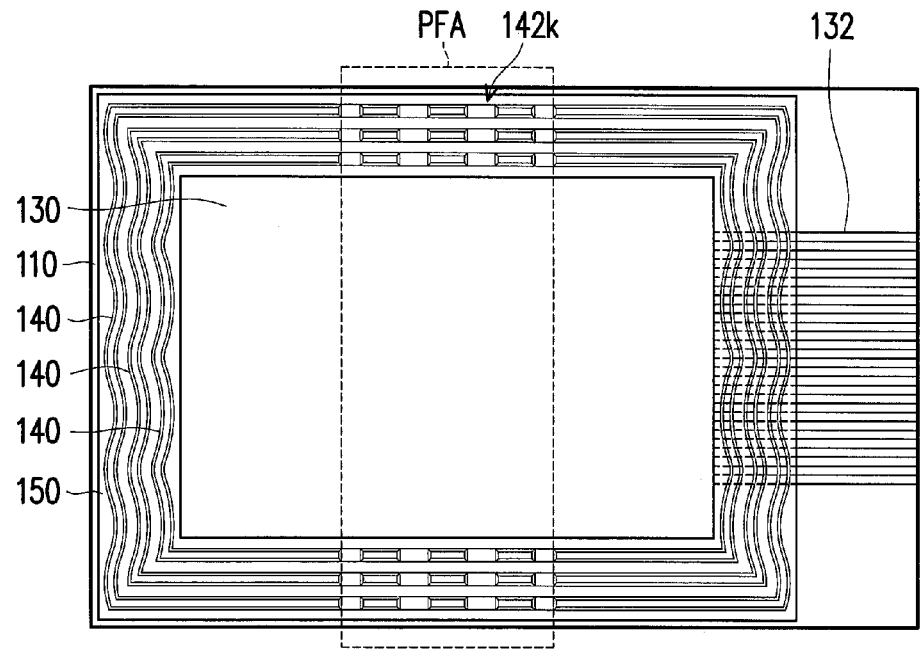
FIG. 12 is a schematic top view illustrating an environmental sensitive electronic device package according to a twelfth exemplary embodiment of the disclosure.

FIG. 12 is a schematic top view illustrating an environmental sensitive electronic device package according to a twelfth exemplary embodiment of the disclosure. The environmental sensitive electronic device package 100L shown in FIG. 12 is similar to the environmental sensitive electronic device package 100A shown in FIG. 1B, while one of the differences therebetween lies in that the side wall barrier structures 140 of the environmental sensitive electronic device package 100L shown in FIG. 12 are surrounding structures comprising a plurality of connected linear patterns and non-linear patterns (e.g., wave patterns). Hence, when the environmental sensitive electronic device package 100L is bent along the predetermined flexure area PFA, the flexure stress dispersing structures 142k may prevent the side wall barrier structures 140 in the predetermined flexure area PFA from being deformed or damaged caused by concentrated stress after the environmental sensitive electronic device package 100L is in a bent state for a period of time.

Figure 13:
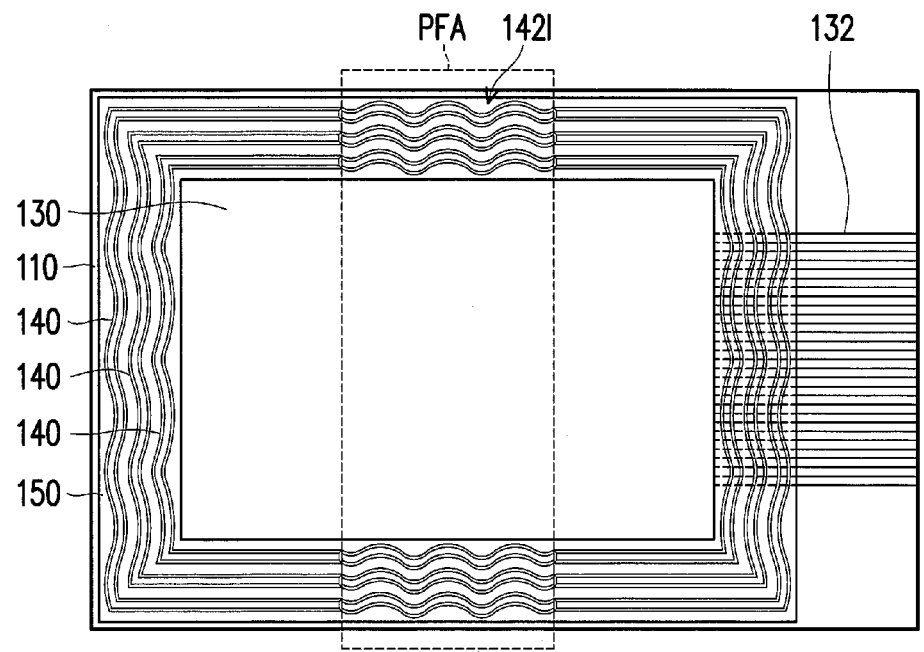
FIG. 13 is a schematic top view illustrating an environmental sensitive electronic device package according to a thirteenth exemplary embodiment of the disclosure.

FIG. 13 is a schematic top view illustrating an environmental sensitive electronic device package according to a thirteenth exemplary embodiment of the disclosure. The environmental sensitive electronic device package 100M shown in FIG. 13 is similar to the environmental sensitive electronic device package 100A shown in FIG. 1B, while one of the differences therebetween lies in that the side wall barrier structures 140 of the environmental sensitive electronic device package 100M shown in FIG. 13 are surrounding structures comprising a plurality of connected linear patterns and non-linear patterns (e.g., wave patterns), and the flexure stress dispersing structures 142l comprises a plurality of non-linear patterns (e.g., wave patterns) arranged in parallel in the predetermined flexure area PFA. Hence, when the environmental sensitive electronic device package 100M is bent along the predetermined flexure area PFA, the flexure stress dispersing structures 142l may prevent the side wall barrier structures 140 in the predetermined flexure area PFA from being deformed or damaged caused by concentrated stress after the environmental sensitive electronic device package 100M is in a bent state for a period of time.

Figure 14:
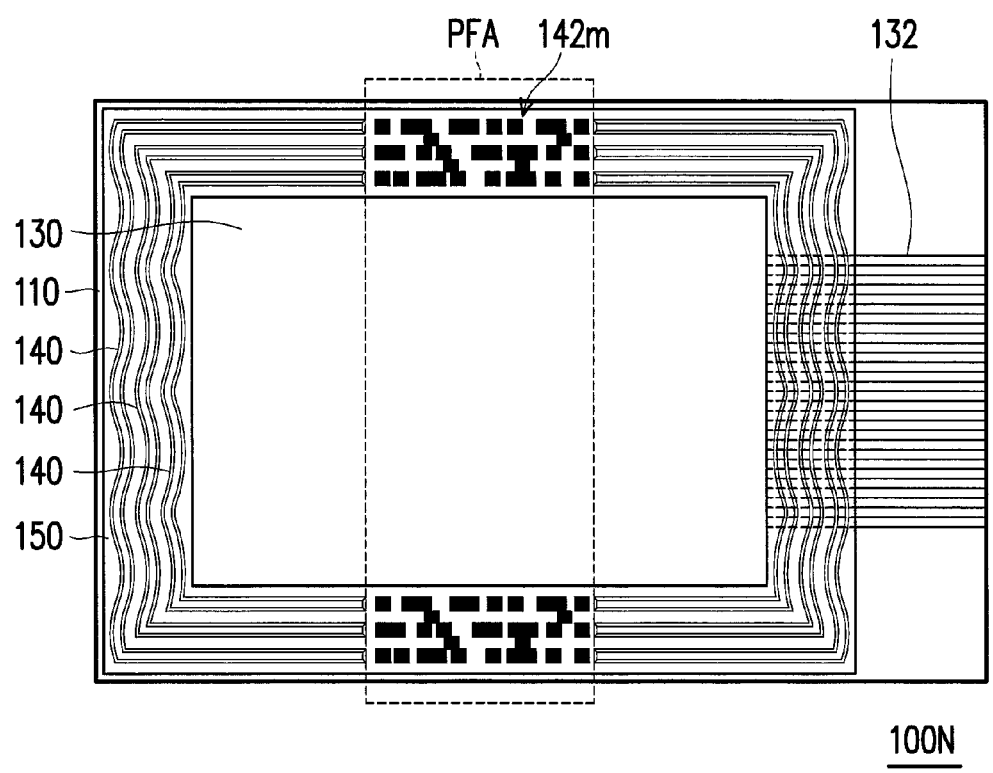
FIG. 14 is a schematic top view illustrating an environmental sensitive electronic device package according to a fourteenth exemplary embodiment of the disclosure.

FIG. 14 is a schematic top view illustrating an environmental sensitive electronic device package according to a fourteenth exemplary embodiment of the disclosure. The environmental sensitive electronic device package 100N shown in FIG. 14 is similar to the environmental sensitive electronic device package 100A shown in FIG. 1B, while one of the differences therebetween lies in that the side wall barrier structures 140 of the environmental sensitive electronic device package 100N shown in FIG. 14 are surrounding structures comprising a plurality of connected linear patterns and non-linear patterns (e.g., wave patterns), and the flexure stress dispersing structures 142m comprises island-shaped patterns irregularly distributed in the predetermined flexure area PFA. The flexure stress dispersing structures 142m are independent from one another or connected to one another, for instance. Hence, when the environmental sensitive electronic device package 100N is bent along the predetermined flexure area PFA, the flexure stress dispersing structures 142m may prevent the side wall barrier structures 140 in the predetermined flexure area PFA from being deformed or damaged caused by concentrated stress after the environmental sensitive electronic device package 100N is in a bent state for a period of time. In other exemplary embodiments that are not shown, the flexure stress dispersing structures of the side wall barrier structures 140 may be grid-shaped patterns that are regularly arranged in the predetermined flexure area PFA.

The side wall barrier structures in other exemplary embodiments may be constituted by the flexure stress dispersing structures, for instance. That is, the environmental sensitive electronic device package may be bent in any direction, and the side wall barrier structures are not deformed or damaged by the concentrated stress while the environmental sensitive electronic device package is being bent in any direction.

To sum up, the substrate of the environmental sensitive electronic device package described herein has the predetermined flexure area, and the side wall barrier structure in the predetermined flexure area has the flexure stress dispersing structure. The flexure stress dispersing structure may comprise the linear pattern, the non-linear pattern, the island-like pattern, or the grid pattern; that is, the types and the arrangement of the flexure stress dispersing structure may be adjusted according to different manner in which the environmental sensitive electronic device package is bent. Thereby, it is likely to prevent the deformation of or the damages to the side wall barrier structure after the environmental sensitive electronic device package is in a bent state for a period of time. Moreover, the water and oxygen resistant abilities of the environmental sensitive electronic device package may be ensured, and the lifetime of the environmental sensitive electronic device can be effectively extended.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive electronic device package comprising:
    a first substrate having at least one predetermined flexure area;
    a second substrate located above the first substrate;
    an environmental sensitive electronic device located on the first substrate and between the first substrate and the second substrate;
    at least one side wall barrier structure located between the first substrate and the second substrate, wherein the at least one side wall barrier structure surrounds the environmental sensitive electronic device and has at least one flexure stress dispersing structure, and the at least one flexure stress dispersing structure is located in the at least one predetermined flexure area, wherein all of the at least one side wall barrier structure and all of the at least one flexure stress dispersing structure are made of the same material, and a pattern of the at least one side wall barrier structure located outside of the at least one predetermined flexure area is different to a pattern of the at least one flexure stress dispersing structure located in the at least one predetermined flexure area, the number of the at least one side wall barrier structure located at one side of the first substrate is plural, and the number of the at least one flexure stress dispersing structure is plural; and
    a filler layer located between the first substrate and the second substrate, the filler layer covering the at least one side wall barrier structure and the environmental sensitive electronic device.

2. The environmental sensitive electronic device package of claim 1, wherein the at least one side wall barrier structure is located on the first substrate.

3. The environmental sensitive electronic device package of claim 1, wherein the at least one side wall barrier structure is located on the second substrate.

4. The environmental sensitive electronic device package of claim 1, wherein the at least one side wall barrier structure comprises:
    at least one first side wall barrier structure located on the first substrate; and
    at least one second side wall barrier structure located on the second substrate, wherein the at least one first side wall barrier structure and the at least one second side wall barrier structure are alternately arranged between the first substrate and the second substrate.

5. The environmental sensitive electronic device package of claim 1, wherein a shape of a cross-section of the at least one side wall barrier structure comprises a polygonal shape, a circular shape, or an elliptic shape, and the cross-section is perpendicular to the first substrate.

6. The environmental sensitive electronic device package of claim 1, wherein the at least one side wall barrier structure comprises:
- a barrier layer located on the first substrate or the second substrate; and
- a cover layer covering the barrier layer.

7. The environmental sensitive electronic device package of claim 1, wherein the at least one side wall barrier structure comprises a surrounding structure, and the surrounding structure comprises a plurality of connected linear patterns.

8. The environmental sensitive electronic device package of claim 1, wherein the at least one side wall barrier structure comprises a surrounding structure, and the surrounding structure comprises a plurality of connected non-linear patterns.

9. The environmental sensitive electronic device package of claim 1, wherein the at least one side wall barrier structure comprises a surrounding structure, and the surrounding structure comprises a plurality of connected linear patterns and non-linear patterns.

10. The environmental sensitive electronic device package of claim 1, wherein the flexure stress dispersing structures comprise linear patterns arranged in parallel in the at least one predetermined flexure area.

11. The environmental sensitive electronic device package of claim 1, wherein the flexure stress dispersing structures comprise linear patterns alternately arranged in columns and rows in the at least one predetermined flexure area.

12. The environmental sensitive electronic device package of claim 1, wherein the flexure stress dispersing structures comprise non-linear patterns arranged in parallel in the at least one predetermined flexure area.

13. The environmental sensitive electronic device package of claim 1, wherein the flexure stress dispersing structures comprise non-linear patterns irregularly distributed in the at least one predetermined flexure area.

14. The environmental sensitive electronic device package of claim 1, wherein the flexure stress dispersing structures are grid-shaped patterns regularly arranged in the at least one predetermined flexure area.

15. The environmental sensitive electronic device package of claim 1, wherein the flexure stress dispersing structures comprise island-shaped patterns irregularly distributed in the at least one predetermined flexure area.

16. The environmental sensitive electronic device package of claim 1, wherein the at least one flexure stress dispersing structure, the at least one side wall barrier structure, and the first substrate are made of metallic or glass material, or the at least one flexure stress dispersing structure, the at least one side wall barrier structure, and the second substrate are made of metallic or glass material.

* * * * *